United States Patent
Jeong

(10) Patent No.: US 9,484,323 B2
(45) Date of Patent: Nov. 1, 2016

(54) METHOD OF MANUFACTURING A SEMICONDUCTOR PACKAGE AND WIRE BONDING APPARATUS FOR PERFORMING THE SAME

(71) Applicant: SAMSUNG ELECTRONICS CO., LTD., Suwon-si (KR)

(72) Inventor: Seok-Won Jeong, Daejeon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/718,438

(22) Filed: May 21, 2015

(65) Prior Publication Data
US 2016/0049382 A1    Feb. 18, 2016

(30) Foreign Application Priority Data

Aug. 18, 2014    (KR) .................... 10-2014-0107280

(51) Int. Cl.
*H01L 21/00*    (2006.01)
*H01L 23/00*    (2006.01)
*H01L 21/66*    (2006.01)
(Continued)

(52) U.S. Cl.
CPC ............ *H01L 24/85* (2013.01); *B23K 20/007* (2013.01); *H01L 22/22* (2013.01); *H01L 24/78* (2013.01); *H01L 24/83* (2013.01); *H01L 24/92* (2013.01); *H01L 25/0657* (2013.01); *H01L 25/50* (2013.01); *B23K 2201/40* (2013.01); *H01L 2224/32145* (2013.01); *H01L 2224/32225* (2013.01); *H01L 2224/48227* (2013.01); *H01L 2224/786* (2013.01); *H01L 2224/789* (2013.01); *H01L 2224/859* (2013.01); *H01L 2224/92247* (2013.01); *H01L 2225/0651* (2013.01); *H01L 2225/06562* (2013.01); *H01L 2225/06596* (2013.01); *H01L 2924/15311* (2013.01)

(58) Field of Classification Search
CPC .............. G01R 31/046; G01R 31/041; G01R 31/2644; G01R 31/26; H01L 24/43; H01L 24/49; H01L 24/45; H01L 24/46; H01L 24/48; H01L 24/85
See application file for complete search history.

(56) References Cited

U.S. PATENT DOCUMENTS

| | | | |
|---|---|---|---|
| 4,586,642 A | 5/1986 | Dreibelbis et al. | |
| 5,058,797 A | 10/1991 | Terakado et al. | |

(Continued)

FOREIGN PATENT DOCUMENTS

| | | |
|---|---|---|
| KR | 10-0439308 B1 | 7/2004 |
| KR | 10-0439309 B1 | 7/2004 |

(Continued)

OTHER PUBLICATIONS

National Instruments, "Opens and Shorts Testing Reference Design," Sep. 8, 2013.*

*Primary Examiner* — Zandra Smith
*Assistant Examiner* — Evan Clinton
(74) *Attorney, Agent, or Firm* — Sughrue Mion, PLLC

(57) ABSTRACT

In a method of manufacturing a semiconductor package, a first semiconductor chip is adhered to a package substrate. An end portion of a wire is bonded to a first bonding pad of the first semiconductor chip by using a capillary. An operating voltage of the first semiconductor chip is applied to the first bonding pad through the wire to detect a leakage current. A second end portion of the wire is bonded to the first connection pad by using the capillary, according to a result of the detection.

17 Claims, 9 Drawing Sheets

(51) Int. Cl.
*H01L 25/00* (2006.01)
*H01L 25/065* (2006.01)
*B23K 20/00* (2006.01)

(56) References Cited

U.S. PATENT DOCUMENTS

| | | | |
|---|---|---|---|
| 5,406,124 A * | 4/1995 | Morita | C08G 73/1071 |
| | | | 257/666 |
| 5,566,877 A | 10/1996 | McCormack | |
| 6,117,693 A * | 9/2000 | Fogal | G01R 31/2853 |
| | | | 228/180.5 |
| 6,853,202 B1 * | 2/2005 | Chang | G01R 31/2853 |
| | | | 324/691 |
| 7,857,190 B2 | 12/2010 | Takahashi et al. | |
| 2011/0062574 A1 * | 3/2011 | Jang | H01L 21/565 |
| | | | 257/686 |
| 2011/0290860 A1 | 12/2011 | Yang et al. | |
| 2013/0048982 A1 | 2/2013 | Patti et al. | |

FOREIGN PATENT DOCUMENTS

| | | |
|---|---|---|
| KR | 10-2005-0109098 A | 11/2005 |
| KR | 10-2006-0097428 A | 9/2006 |
| KR | 10-2007-0057452 A | 6/2007 |
| KR | 10-0752221 B1 | 8/2007 |

* cited by examiner

METHOD OF MANUFACTURING A SEMICONDUCTOR PACKAGE AND WIRE BONDING APPARATUS FOR PERFORMING THE SAME

CROSS-REFERENCE TO RELATED APPLICATION

This application claims priority from Korean Patent Application No. 10-2014-0107280, filed on Aug. 18, 2014, in the Korean Intellectual Property Office, the disclosure of which is herein incorporated in its entirety by reference.

BACKGROUND

1. Field

Methods and Apparatuses consistent with exemplary embodiments relate to a method of manufacturing a semiconductor package and a wire bonding apparatus for performing the same, and more particularly, to a method of manufacturing a semiconductor package including a plurality of semiconductor chips stacked on each other and a wire bonding apparatus for performing the same.

2. Description of the Related Art

A semiconductor packaging process may include a die attach process for adhering a semiconductor chip to a package substrate, a bonding wire process for electrically connecting the semiconductor chip and the package substrate, and a molding process for covering the semiconductor chip with epoxy resin. After the semiconductor packaging process is performed, a test process may be performed on an individually divided unit package. Accordingly, a failure which has occurred in the packaging process may be detected through the test process.

Multi-stack package (MSP) techniques are characterized by mounting a plurality of semiconductor chips into a single package. In manufacturing a multi-stack package, a failure occurring in the bonding wire process may result in a malfunction of a final package, thus decreasing fabrication yields.

SUMMARY

One or more example embodiments provide a method of manufacturing a semiconductor package capable of improving fabrication yields.

One or more example embodiments provide a wire bonding apparatus for performing the above method.

According to an aspect of an example embodiment, a method of manufacturing a semiconductor package includes: adhering a first semiconductor chip to a package substrate; bonding a first end portion of a wire to a first bonding pad of the first semiconductor chip by using a capillary; applying an operating voltage of the first semiconductor chip to the first bonding pad through the wire to determine whether a leakage current is detected; and bonding a second end portion of the wire to the first connection pad by using the capillary, according to a result of the determining In example embodiments, the first bonding pad may include a power pad.

In example embodiments, the applying may include applying the operating voltage of at least about 1.8V to the first bonding pad.

In example embodiments, the method may further include applying a current or a voltage to the first bonding pad through the wire to detect at least one of a wire open failure and a wire short failure, prior to the bonding the second end portion of the wire to the first connection pad.

In example embodiments, the applying the voltage or the voltage may include applying a first voltage to the first bonding pad to detect the wire open failure based on a current flowing through the first bonding pad, and applying a second voltage greater than the first voltage to the first bonding pad to detect the wire short failure based on the current flowing through the first bonding pad.

In example embodiments, the applying the current or the voltage may include applying a first current to the first bonding pad and detecting a voltage of the first bonding pad, determining the wire open failure in response to the detected voltage being less than a first voltage, and determining the wire short failure in response to the detected voltage being greater than a second voltage, wherein the second voltage is greater than the first voltage.

In example embodiments, the method may further include bonding an end portion of a second wire to a second bonding pad of the first semiconductor chip and applying a current or a voltage to the second bonding pad through the second wire to detect at least one of a wire open failure and a wire short failure while the capillary is moved to a second connection pad of the package substrate.

In example embodiments, the first bonding pad may include a power pad and the second bonding pad may include at least one of a control pad and a data pad.

In example embodiments, the applying the current or the voltage may include applying a first voltage to the second bonding pad to detect the wire open failure based on a current flowing through the second bonding pad and applying a second voltage greater than the first voltage to the second bonding pad to detect the wire short failure based on the current flowing through the second bonding pad.

In example embodiments, the applying the current or the voltage may include applying a first current to the second bonding pad and detecting a voltage of the second bonding pad, determining the wire open failure in response to the detected voltage being less than a first voltage, and determining the wire short failure in response to the detected voltage being greater than a second voltage, wherein the second voltage is greater than the first voltage.

In example embodiments, the method may further include adhering a second semiconductor chip to the first semiconductor chip and forming a molding member on the package substrate to cover the first and second semiconductor chips.

In example embodiments, the method may further include bonding a first end portion of a third wire to a third bonding pad of the second semiconductor chip, by using the capillary, applying an operating voltage of the second semiconductor chip to the third bonding pad through the third wire to determine whether a leakage current is detected, and bonding a second end portion of the third wire to the third connection pad, according to a result of the determining.

According to an aspect of an example embodiment, a method of manufacturing a semiconductor package includes: adhering a semiconductor chip to a package substrate, the semiconductor chip having a plurality of bonding pads, the package substrate having a plurality of connection pads; applying an operating voltage of the semiconductor chip to a power pad among the plurality of bonding pads to detect a leakage current, when respectively connecting the plurality of bonding pads to the plurality of connection pads by wires; and applying a current or a voltage to at least one of a control pad and a data pad among the plurality of bonding pads to detect at least one of a wire open failure and a wire short failure.

In example embodiments, the method may further include applying the current or the voltage to the power pad to detect the at least one of a wire open failure and the wire short failure.

In example embodiments, the applying the current or the voltage may include applying a first voltage to the at least one of the control pad and the data pad to detect the wire open failure based on a current flowing through the at least one of the control pad and the data pad, and applying a second voltage greater than the first voltage to the at least one of the control pad and the data pad to detect the wire short failure based on the current flowing through the at least one of the control pad and the data pad.

In example embodiments, the applying the current or the voltage may include applying a first current to the at least one of the control pad and the data pad and detecting a voltage of the at least one of the control pad and the data pad, determining the wire open failure in response to the detected voltage being less than a first voltage or not, and determining the wire short failure in response to the detected voltage being greater than a second voltage, wherein the second voltage is greater than the first voltage.

According to an aspect of an example embodiment, an apparatus for bonding a wire in manufacturing a semiconductor package, the semiconductor package comprising a semiconductor chip disposed on a package substrate, includes: a capillary having a wire inserted therethrough; a detector configured to detect a failure of a wire connected to a bonding pad of the semiconductor chip and detect a leakage current of the bonding pad, the detector being electrically connected to the wire and the capillary connecting the wire to the bonding pad; and a controller configured to determine whether to connect the bonding pad of the semiconductor chip to a connection pad of the package substrate by using the wire, based on whether the failure of the wire is detected and to control an operation of the capillary.

In example embodiments, the detector may include a voltage source configured to apply a voltage to the bonding pad through the wire; and a current measurer configured to measure a current flowing through the wire in response to the applied voltage, wherein the detector is configured to detect the failure of the wire based on a level of the measured current flowing through the wire.

In example embodiments, the detector may include a current source configured to apply a current to the bonding pad through the wire; and a voltage measurer configured to measure a voltage of the bonding pad in response to the applied current, wherein the detector is configured to detect the failure of the wire based on a level of the measured voltage of the bonding pad.

In example embodiments, the apparatus may further include a voltage source configured to apply an operating voltage of the semiconductor chip to the bonding pad through the wire; and a current measurer configured to measure a current flowing through the bonding pad in response to the applied voltage, wherein the detector is configured to detect the leakage current in the bonding pad based on a measured current flowing through the wire.

According to an aspect of an example embodiment, a wire bonding apparatus includes a wire bonding portion having a capillary having a wire inserted therethrough to perform wire bonding between a boding pad of a semiconductor chip and a connection pad of a package substrate, an electrical detector electrically connected to the wire and including a first detector for applying an operating voltage to the boding pad to detect leakage current and a second detector for applying a current or voltage to the bonding pad to detect a wire open failure and a wire short failure, and a bonding controller connected to the wire bonding portion and the electrical detector to control operations of the capillary based on the detected result of the electrical detector.

According to example embodiments, during a bonding wire process, a current or voltage of each wire bonded to each bonding pad may be measured, to detect a wire open and/or short failure and a leakage current in real time.

Accordingly, a failure of a wire which has occurred in the bonding wire process may be detected in real time without performing a test process on a final semiconductor package, to prevent a loss of a semiconductor chip of a multi-chip package.

BRIEF DESCRIPTION OF THE DRAWINGS

The above and/or other aspects will become more apparent by describing certain example embodiments with reference to the accompanying drawings.

DETAILED DESCRIPTION

Figure 1:
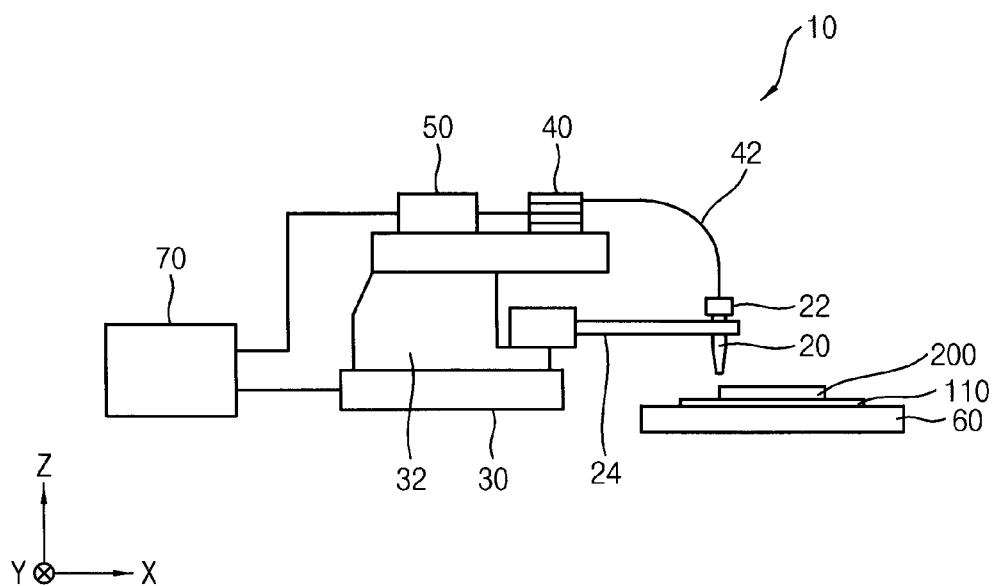
FIG. 1 is a block diagram illustrating a wire bonding apparatus in accordance with example embodiments.

Various example embodiments will be described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
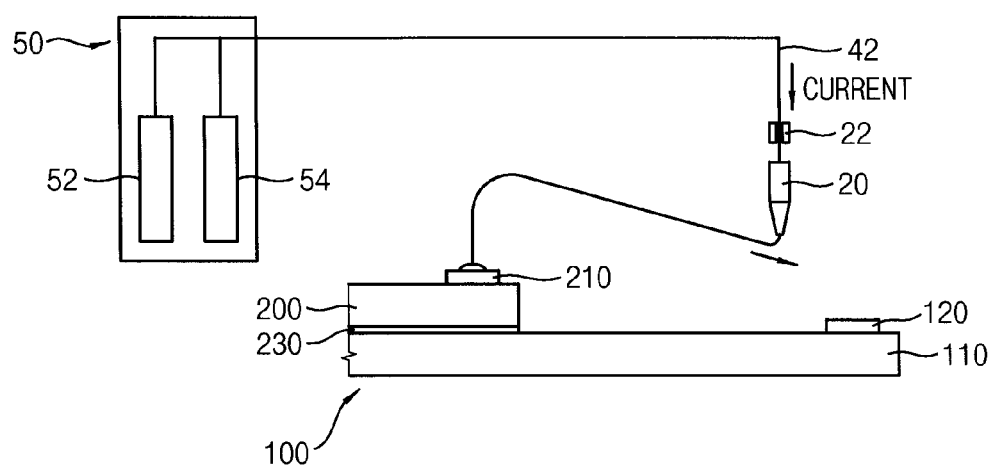
FIG. 2 is a block diagram illustrating an electrical detector for detecting electrical properties of a boding wire in FIG. 1.
Figure 3:
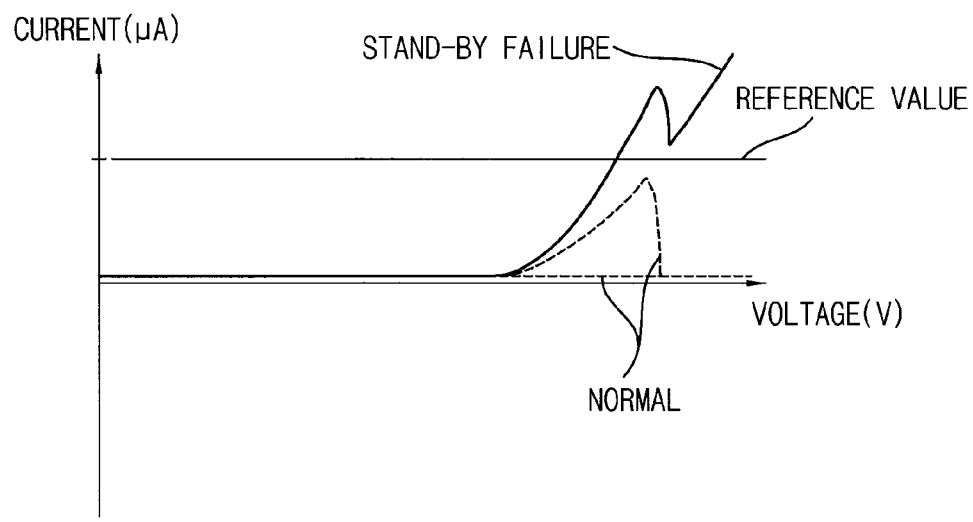
FIG. 3 is a graph illustrating a current flowing through a wire connected to a bonding pad, detected by a first detector in FIG. 2 in accordance with example embodiments.
Figure 4:
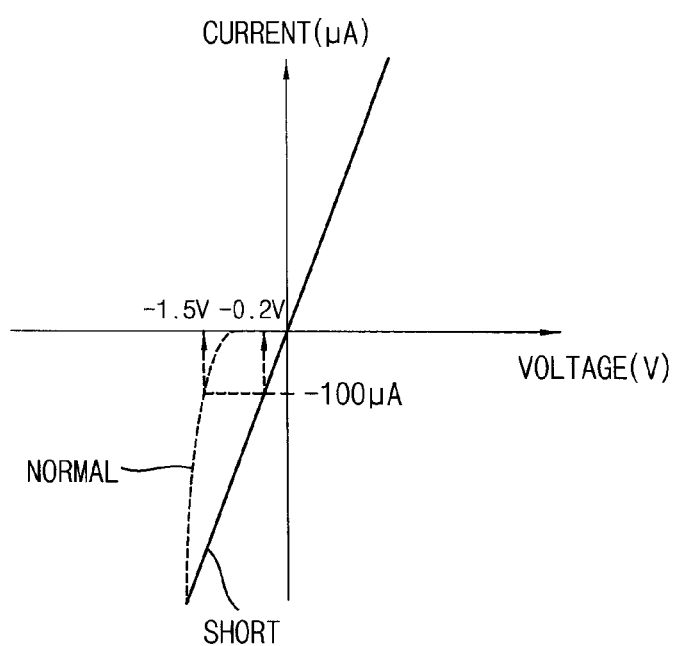
FIG. 4 is a graph illustrating a voltage of a bonding pad detected by a second detector in FIG. 2 in accordance with example embodiments.
Figure 5:
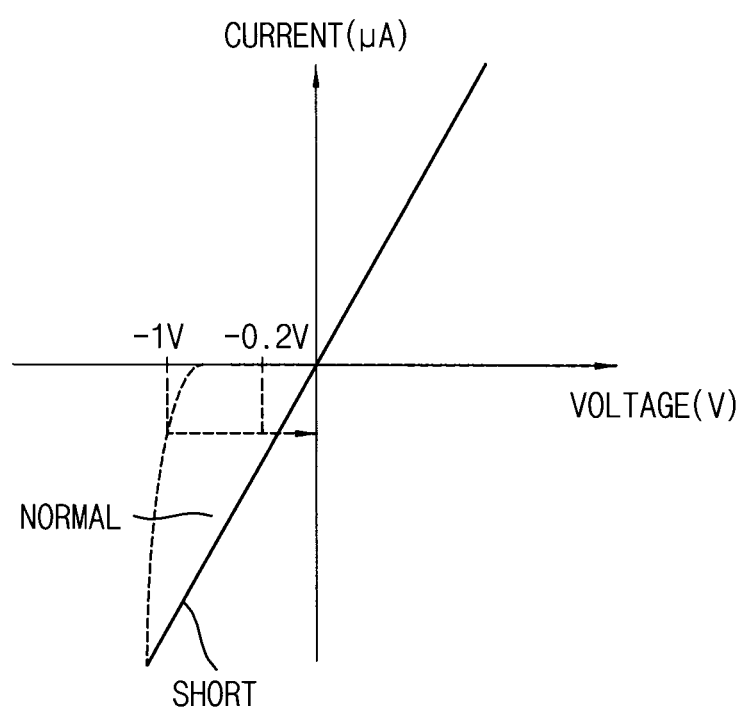
FIG. 5 is a graph illustrating a current, flowing through a wire connected to a bonding pad, detected by a second detector in FIG. 2 in accordance with example embodiments.

FIG. 1 is a block diagram illustrating a wire bonding apparatus in accordance with example embodiments. FIG. 2 is a block diagram illustrating an electrical detector for detecting electrical properties of a boding wire in FIG. 1. FIG. 3 is a graph illustrating a current flowing through a wire connected to a bonding pad, detected by a first detector in FIG. 2 in accordance with example embodiments. FIG. 4 is a graph illustrating a voltage of a bonding pad detected by a second detector in FIG. 2 in accordance with example embodiments. FIG. 5 is a graph illustrating a current, flowing through a wire connected to the bonding pad, detected by a second detector in FIG. 2 in accordance with example embodiments.

Referring to FIGS. 1 to 5, a wire bonding apparatus 10 may include a wire bonding part having a capillary 20 for performing wire bonding between a bonding pad 210 of a semiconductor chip 200 and a connection pad 120 of a package substrate 110, which is mounted on a substrate 60, an electrical detector 50 electrically connected to a wire 42 and applying a test detection signal to the wire 42 to determine whether the wire 42 bonded to the bonding pad 210 has a failure, and a bonding controller 70 connected to the wire bonding part and the electrical detector 50 to control operations of the capillary 20 based on a result of detection of the electrical detector 50.

In example embodiments, the wire bonding apparatus 100 may perform a test process during a wire bonding process, instead of after performing a semiconductor packaging process, to detect a failure of the wire 42 bonded to the bonding pad 210.

As illustrated in FIG. 1, the wire bonding part of the wire bonding apparatus 10 may include a bonding head 32 installed on an X-Y table 30, a bonding arm 24 extending in an X direction from the bonding head 32, the capillary 20 installed in a front end portion of the bonding arm 24, and at least one clamper 22 for gripping the wire 42 inserted through the capillary 20.

The bonding head 32 may be controlled by the bonding controller 70 such that the bonding head 32 may move horizontally in directions along X and Y axes on the X-Y table 30. The bonding arm 24 may be controlled by the bonding controller 70 such that the bonding arm 24 may move upward and/or downward (or vertically) in a direction along a Z axis on the X-Y table 30. Accordingly, the capillary 20 in the front end portion of the bonding arm 24 may be controlled by the bonding controller 70 such that the capillary 20 may move in at least one direction of directions along X, Y, and Z axes directions.

The wire 42 may be wound up on a spool 40 on the bonding head 32. The spool 40 may supply the wire 42 through the capillary 20. The clamper 22 may be movable in the direction along the Z axis to grip the wire 42 through an opening and/or closing operation thereof. A ball generation part (not illustrated) may be disposed adjacent to a tip end portion of the wire 42. The ball generation part may include a discharge torch for forming a ball at the tip end portion of the wire 42.

The electrical detector 50 may include a first detector 52 and a second detector 54 electrically connected to the wire 42. The electrical detector 50 may be installed on the bonding head 32 and arranged adjacent to the spool 40.

As illustrated in FIG. 2, after the wire 42 is bonded to the bonding pad 210 of the semiconductor chip 200 by the capillary 20, the capillary 20 may move toward the connection pad 120 of the package substrate 110. A plurality of the bonding pads 210 of the semiconductor chip 200 may be arranged in a peripheral region (e.g., at least one side portion) of the semiconductor chip 200. During the movement of the capillary 20 toward the connection pad 120 of the package substrate 110, the first detector 52 may apply an operating voltage to the bonding pad 210 through the wire 42 to perform a leakage current test (or standby test). In addition, during the movement of the capillary 20 toward the connection pad 120 of the package substrate 110, the second detector 54 may apply a current or voltage to the bonding pad 210 through the wire 42 to perform a wire open test and a wire short test together.

In example embodiments, the first detector 52 may include a voltage source current measurement (VSIM) for applying an operating voltage to the bonding pad 210. For example, the first detector 52 may include a voltage source for applying a voltage to the bonding pad 210 through the wire 42 and an amperemeter (IM) for measuring a current flowing through the wire 42. The first detector 52 may apply a voltage of at least operating voltage of the semiconductor chip 200 to the bonding pad 210.

For example, in case in which the semiconductor chip 200 includes volatile memory devices such as a dynamic random access memory (DRAM), the first detector 52 may apply a voltage of +1.8V or more to the boding pad 210 of the semiconductor chip 200. In case in which the semiconductor chip 200 includes non-volatile memory devices such as flash memories, the first detector 52 may apply a voltage of +3.6V or more to the bonding pad 210 of the semiconductor chip 200.

As illustrated in FIG. 3, the first detector 52 may apply a voltage of at least operating voltage of the semiconductor chip 200 to the bonding pad 210 to measure a current flowing through the wire 42. When the detected current is greater than a predetermined value, it may be determined that a leakage current (or standby) failure occurs in the boding pad 210 bonded to the wire 42.

In example embodiments, the second detector 54 may include a current source voltage measurement (ISVM) for applying a constant current to the bonding pad 210. For example, the second detector 54 may include a current source for applying a constant current to the bonding pad 210 through the wire 42 and a voltmeter (VM) for measuring a voltage of the bonding pad 210.

As illustrated in FIG. 4, the second detector 54 may apply a constant current (for example, −100 μA) to the bonding pad 210 through the wire 42 to measure a voltage of the bonding pad 210. When the detected voltage is less than −1.5V, it may be determined that a wire open failure occurs. When the detected voltage is greater than −0.2V, it may be determined that a wire short failure occurs. When the detected voltage is in a range of −1.5V through −0.2V, it may be determined that the wire 42 is in a normal state.

In example embodiments, the second detector 54 may include a voltage source current measurement (VSIM) for applying a first voltage and a second voltage, which is different from the first voltage, to the bonding pad 210. For example, the second detector 54 may include a variable voltage source for applying the first voltage or the second voltage to the bonding pad 210 through the wire 42 and an amperemeter (IM) for measuring a current flowing through the wire 42. The first detector 52 may apply a voltage of at least operating voltage of the semiconductor chip 200 to the bonding pad 210.

As illustrated in FIG. 5, the second detector 54 may apply a first voltage (for example, −1V) of the semiconductor chip 200 to the bonding pad 210 to measure a current flowing through the wire 42, and may apply a second voltage (for example, −0.2V) greater than the first voltage to measure a current flowing through the wire 42. When the detected current is about zero at the first voltage, it may be determined that a wire open failure occurs. When a current is detected at the second voltage, it may be determined that a wire short failure occurs.

As mentioned above, the wire bonding apparatus 10 may perform a wire bonding process between the bonding pad 210 of the semiconductor chip 200 and the connection pad 120 of the package substrate 110. The wire bonding apparatus 10 may include the first detector 52 and the second detector 54 electrically connected to the wire 42, which is bonded to the bonding pad 210. The first detector 52 may apply an operating voltage to the bonding pad 210 through the wire 42 to detect a leakage current failure. The second detector 54 may apply a current or a voltage to the boding pad 210 to detect a wire open failure and/or a wire short failure.

Accordingly, whether each of the wires 42 is in a normal state may be determined during a wire bonding process, without performing a test process on a final semiconductor package after being assembled, and thus, only semiconductor chips determined to be in a normal state during the wire bonding process may be stacked onto each other, thereby reducing a failure rate of a multi-chip package.

Hereinafter, a method of manufacturing a semiconductor package using the wire bonding apparatus in FIG. 1 will be explained.

Figure 6:
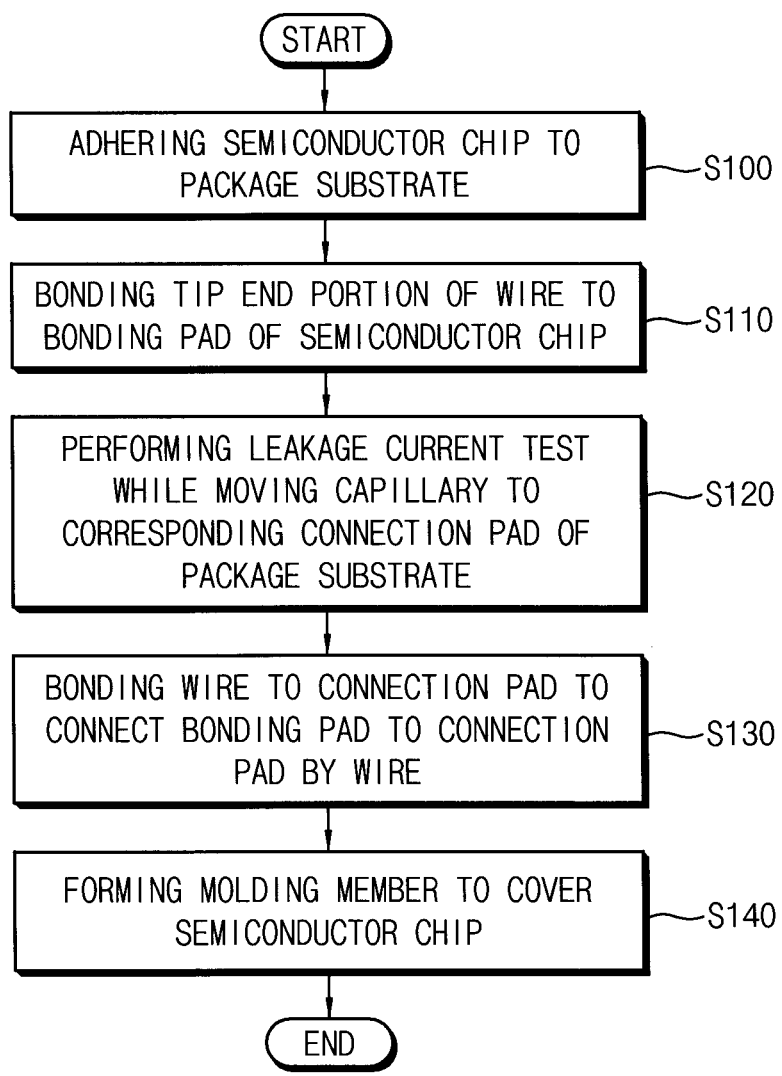
FIG. 6 is a flowchart illustrating a method of manufacturing a semiconductor package in accordance with example embodiments.

FIG. 6 is a flowchart illustrating a method of manufacturing a semiconductor package in accordance with example embodiments. FIGS. 7 to 11 are views illustrating a method of manufacturing a semiconductor package in accordance with example embodiments. FIG. 9 is a plan view illustrating a portion of a semiconductor chip in FIG. 8.

Figure 7:
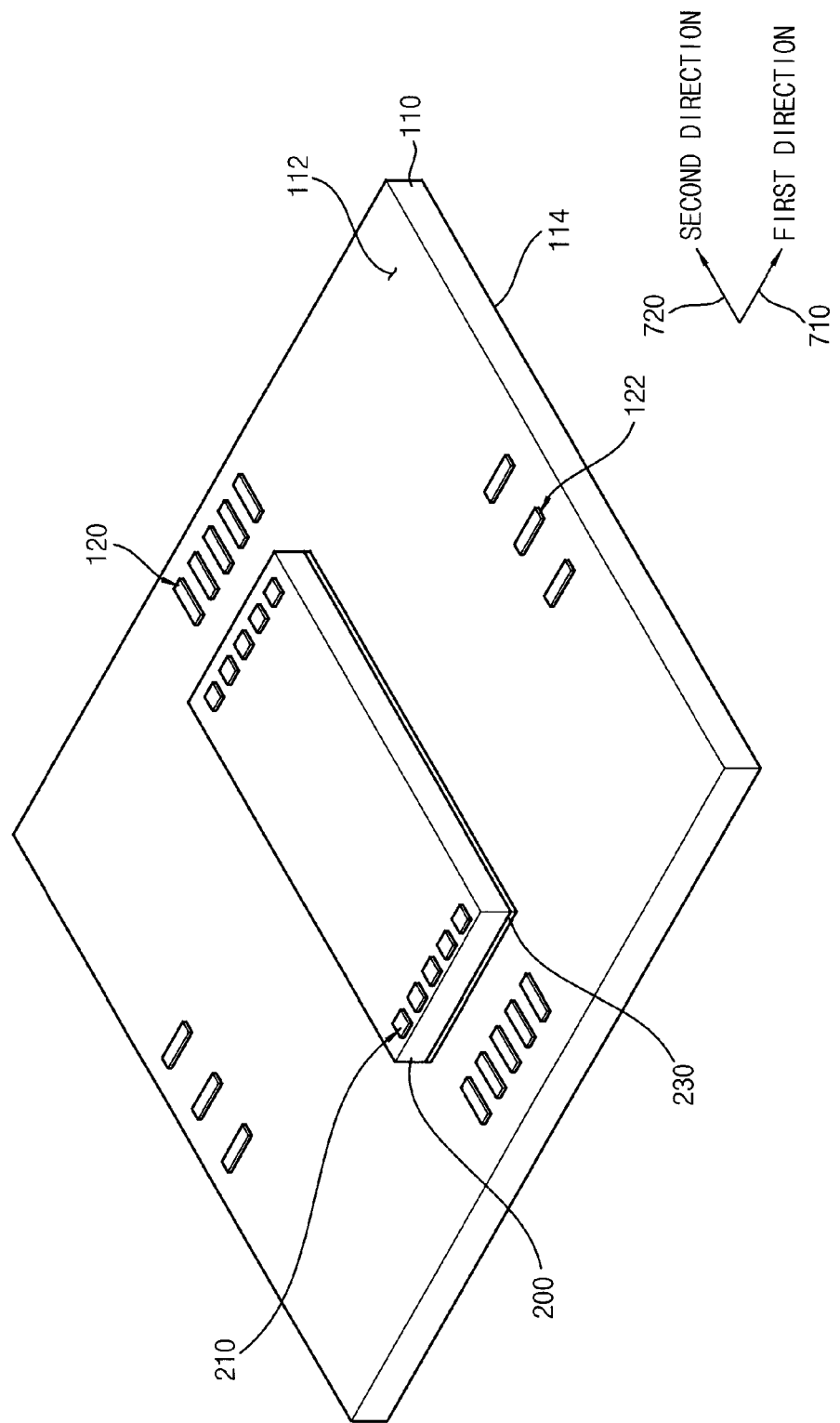
FIGS. 7 to 11 are views illustrating a method of manufacturing a semiconductor package in accordance with example embodiments.

Referring to FIGS. 6 and 7, a first semiconductor chip 200 may be adhered to a package substrate 110 (S100).

In example embodiments, the package substrate 110 may be a printed circuit board having a first surface 112 and a second surface 114, which is opposite to the first surface 112. The printed circuit board may include a multi-layered circuit board having vias and various circuits therein.

A plurality of first and second connection pads 120 and 122 may be arranged on the first surface 112 of the package substrate 110. The first connection pads 120 may be provided for electrical connection with the first semiconductor chip 200. The second connection pads 122 may be provided for electrical connection with a second semiconductor chip 300 (see FIG. 10). A plurality of outer connection pads (not illustrated) may be arranged on the second surface 114 of the package substrate 110.

The first semiconductor chip 200 may be adhered to the first surface 112 of the package substrate 110. The first semiconductor chip 200 may be adhered to the package substrate 110 via a first adhesive layer 230. For example, the first adhesive layer 230 may include epoxy, polyimide, etc.

A plurality of boding pads 210 may be formed on an active surface of the first semiconductor chip 200. The bonding pads 210 may be arranged along first and second end portions of the first semiconductor chip 200, the first and second end portions being opposite to each other in a second direction 720. The bonding pads 210 may be arranged in peripheral regions of the first and second end portions of the first semiconductor chip 200 in a first direction 710. However, arrangements of the bonding pads 210 may not be limited thereto.

Figure 8:
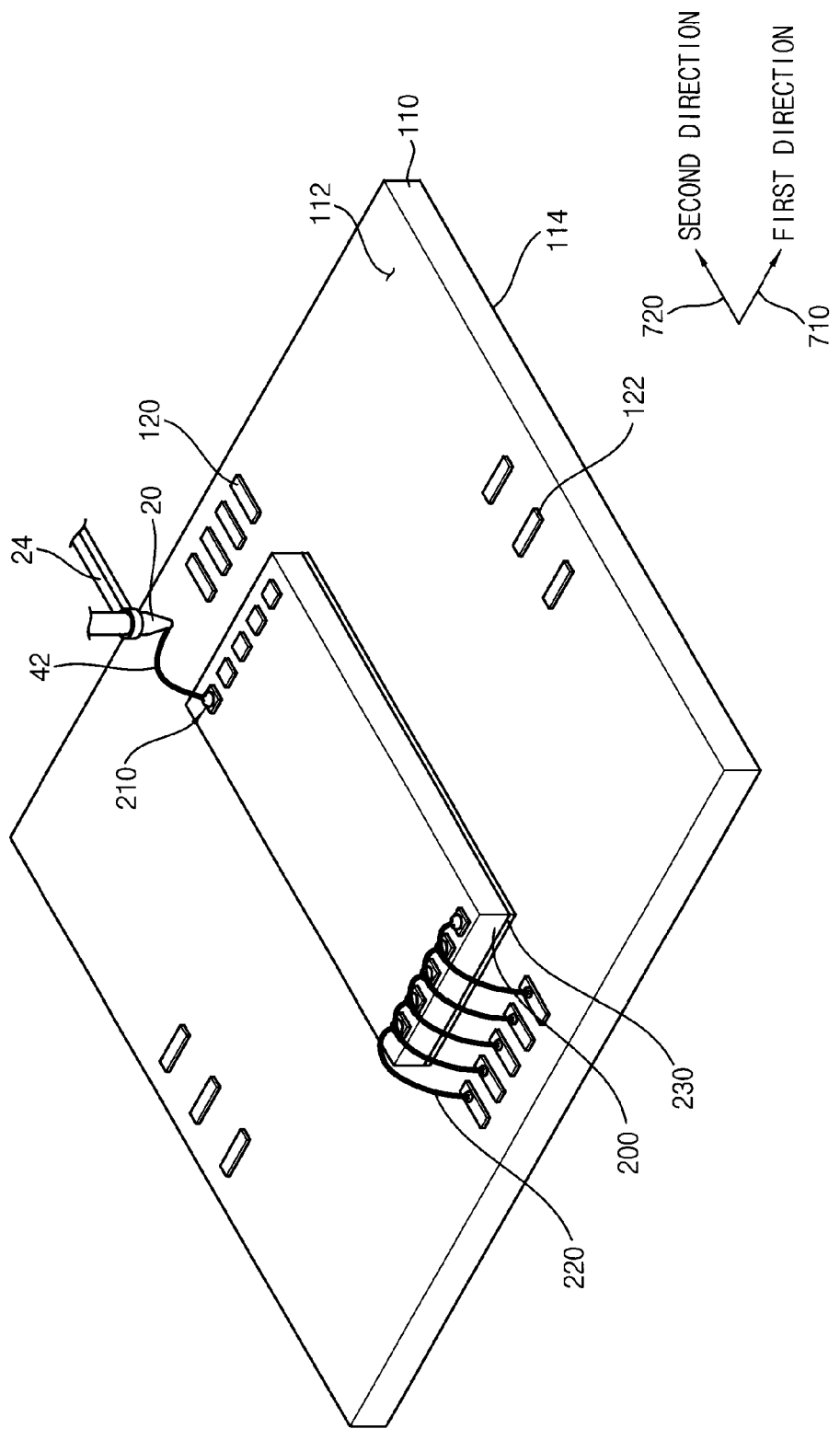
Figure 9:
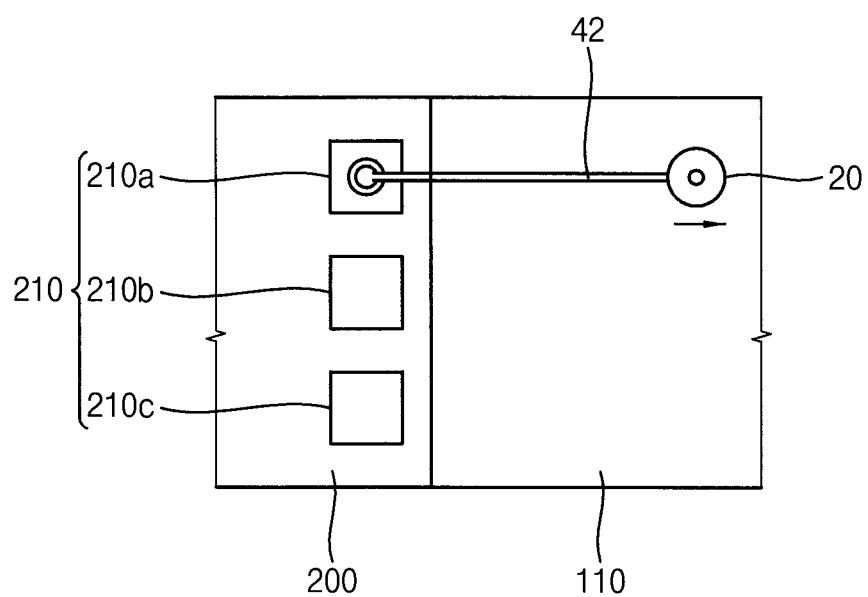

Referring to FIGS. 6, 8 and 9, bonding wires 220 may electrically connect the bonding pads 210 of the first semiconductor chip 200 to the first connection pads 120. The bonding wires 220 may be formed using the wire 42 by a bonding wire process. During the bonding wire process, whether each of the wires 42 bonded to the bonding pads 210 has a failure may be tested, and the wires 42 are bonded to the first connection pads 120 to connect the bonding pads 210 to the first connection pads 120 based on a result of the test (S110, S120, S130).

In example embodiments, the capillary 20 of the wire bonding apparatus 10 (see FIG. 1) may move to the bonding pad 210 (or a first bonding point of the bonding pad 210) to bond the wire 42 to the bonding pad 210. A ball formed by a discharge torch may be compressed on the bonding pad 210 such that a tip end portion of the wire 42 may be bonded to the bonding pad 210. Another end portion of the wire 42 may be withdrawn from the capillary 20 to move from the bonding pad 210 to the first bonding pad 120.

As illustrated in FIG. 9, in example embodiments, the bonding pad 210 may include a power pad 210a, a control pad 210b and a data pad 210c. A power signal (e.g., power voltage (VDD) and/or ground voltage (VSS)) may be inputted to the first semiconductor chip 200 through the power pad 210a. A control signal and a data signal may be inputted and/or outputted to and/or from the first semiconductor chip 200 through the control pad 210b and the data pad 210c, respectively.

The wire bonding apparatus 10 may respectively connect the power pad 210a, the control pad 210b and the data pad 210c to corresponding first connection pads 120 using the wire 42.

As illustrated in FIG. 9, while the tip end portion of the wire 42 is bonded to the power pad 210a (or the first bonding point of the power pad 210a) and the capillary 20 moves to the corresponding first connection pad 120, a leakage current test (or standby test) may be performed on the power pad 210a to which the tip end portion of the wire 42 is bonded. The leakage current test may be performed using a voltage source current measurement (VSIM). In particular, a voltage of at least operating voltage of the semiconductor chip 200 may be applied to the power pad 210a and a current flowing through the wire 42 may be measured. When the detected current is greater than a predetermined value, it may be determined that a leakage current (or standby) failure occurs in the power pad 210a that is bonded to the wire 42.

Next, depending on the result of the leakage current test, the wire 42 may be bonded to the first connection pad 120 (or a second bonding point of the first connection pad 120) to connect the power pad 210a to the first connection pad 120. If the result of the leakage current test indicates a normal operation of the wire 42, the power pad 210a and the first connection pad 120 may be connected by the wire 42. If the result of the leakage current test indicates a leakage current failure, a subsequent process may not be performed.

After the power pad 210a is connected to the corresponding first connection pad 120 by the wire 42, the capillary 20 of the wire bonding apparatus 10 may move to the control pad 210b to bond the wire to the control pad 210b. While the capillary 20 moves to the first connection pad 120, a current or voltage may be applied to the control pad 210b through the wire 42 to perform a wire open test and/or a wire short test.

The wire open test and/or the wire short test may be performed using a current source voltage measurement (ISVM) or a voltage source current measurement (VSIM). In particular, in case of using a current source voltage measurement (ISVM) test mode, a constant current may be applied to the control pad 210b and a voltage of the control pad 210b may be measured to detect a wire open failure and/or a wire short failure. For example, a current of −100 µA may be applied to the control pad 210b through the wire 42. When the detected voltage is less than −1.5V, it may be determined that a wire open failure occurs. When the detected voltage is greater than −0.2V, it may be determined that a wire short failure occurs. When the detected voltage is in a range of −1.5V through −0.2V, it may be determined that the wire 42 is in a normal state.

Alternatively, in case of using the voltage source current measurement (VSIM) test mode, a first voltage and a second voltage, which is different from the first voltage, may be applied to the control pad 210b through the wire 42 and a current flowing through the wire 42 may be measured to detect a wire open failure and/or a wire short failure. For example, a first voltage (for example, −1V) may be applied and a current flowing through the wire 42 may be measured, and a second voltage (for example, −0.2V) greater than the first voltage may be applied and a current flowing through the wire 42 may be measured. When the detected current is about zero at the first voltage, it may be determined that a wire open failure occurs. When a current is detected at the second voltage, it may be determined that a wire short failure occurs.

Next, depending on the result of detecting the wire open failure and/or the wire short failure, the wire 42 may be bonded to the first connection pad 120 to connect the control pad 210b to the first connection pad 120.

After the control pad 210b is connected to the corresponding first connection pad 120 by the wire 42, the capillary 20 of the wire bonding apparatus 10 may move to the data pad 210c to bond the wire 42 to the data pad 210c. Next, while the capillary 20 moves to the first connection pad 120, a current or voltage may be applied to the data pad 210c through the wire 42 to perform a wire open test and/or a wire short test. The wire open test and the wire short test of the data pad 210c may be substantially the same as those performed with respect to the control pad 210b.

In example embodiments, together with the leakage current test of the power pad 210a, while the capillary 20 moves to the first connection pad 120, a current or voltage may be applied to the power pad 210a through the wire 42 to perform both the wire open test and/or the wire short test. Similarly, together with the wire open test and/or the wire short test of the control pad 210b and the data pad 210c, while the capillary 20 moves to the first connection pad 120, a leakage current test of the control pad 210b and the data pad 210c, which are respectively bonded to the tip end portions of the wire 42, may be performed.

Figure 10:
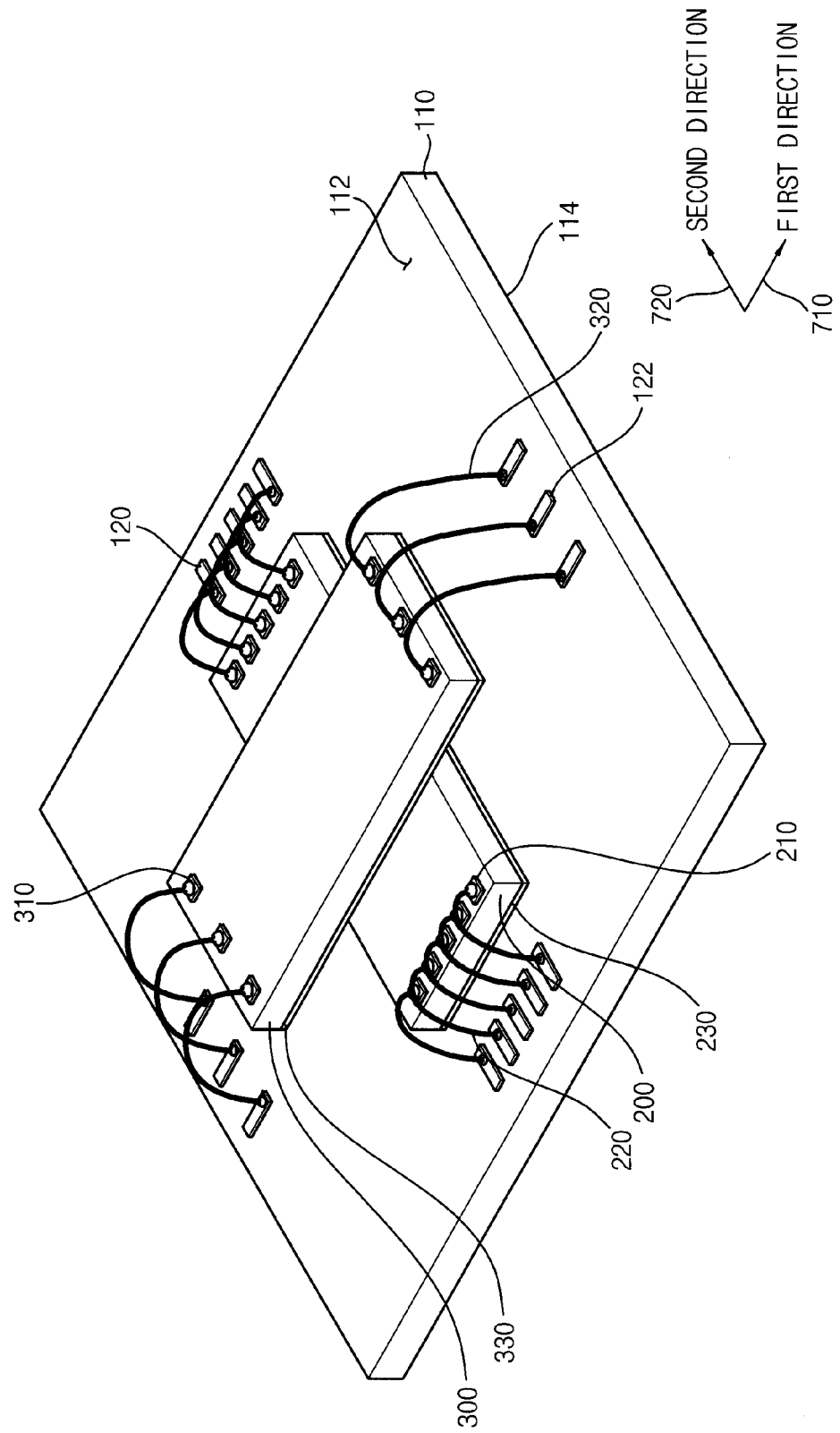
Figure 11:
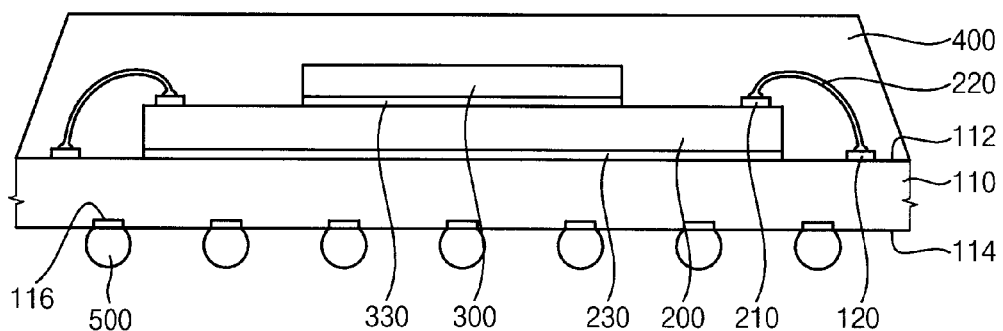

Referring to FIGS. 6, 10 and 11, after a second semiconductor chip 300 is stacked on the first semiconductor chip 200, a molding member 400 may be formed on the package substrate 110 to cover the first and second semiconductor chips 200, 300 (S140).

The second semiconductor chip 300 may be stacked on the first semiconductor chip 200 such that an end portion of the second semiconductor chip 300 in the first direction 710 may protrude laterally from an end portion of the first semiconductor chip 200 in the first direction 710. That is, the second semiconductor chip 300 may have an overhang portion protruding from the end portion of the first semiconductor chip 200. The second semiconductor chip 300 may have a size different from a size of the first semiconductor chip 200. Alternatively, the second semiconductor chip 300 may have a size substantially the same as the size of the first semiconductor chip 200. A longitudinal direction (e.g., the first direction 710) of the second semiconductor chip 300 may be substantially perpendicular to a longitudinal direction (e.g., the second direction 720) of the first semiconductor chip 200. However, it may be understood that arrangements of the semiconductor chips, and the number of the stacked semiconductor chips according to example embodiments may not be limited thereto.

The second semiconductor chip 300 may be adhered to the first semiconductor chip 200 via a second adhesive layer 330. For example, the second adhesive layer 330 may include epoxy, polyimide, etc.

A plurality of second boding pads 310 may be formed on an active surface of the second semiconductor chip 300. The second bonding pads 310 may be arranged along first and second end portions of the second semiconductor chip 300, the first and second end portions being opposite to each other in the first direction 710. The bonding pads 210 may be arranged in peripheral regions of first and second end portions of the first semiconductor chip 200 in the second direction 720. However, arrangements of the second bonding pads 310 may not be limited thereto.

Next, the second bonding pads 310 of the second semiconductor chip 300 may be electrically connected to the second connection pads 122 by bonding wires 320. While a bonding wire process is performed using wires 42, whether each of the wires 42 bonded to the second bonding pads 310 has a failure may be tested.

Next, the molding member 400 may be formed on the first surface 112 of the package substrate 110 to form a semiconductor package 100. The molding member 400 may cover the first and second semiconductor chips 200 and 300 to protect the first and second semiconductor chips 200 and 300 from outside.

A plurality of solder ball pads 116 may be arranged on the second surface 114 of the package substrate 110. Solder balls 500 may be disposed on the solder ball pads 116, and next, the semiconductor package 100 may be mounted on a module substrate (not illustrated) via the solder balls 500.

As mentioned above, during a bonding wire process, a current or voltage of each wire bonded to each bonding pad may be measured, to detect a wire open and/or a short failure and a leakage current in real time. Accordingly, a failure which has occurred in the bonding wire process may be detected in real time without performing a test on a final semiconductor package after a semiconductor packaging process is performed. Accordingly, a loss of a semiconductor chip of a multi-chip package may be prevented.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the inventive concept. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor package, the method comprising:
    adhering a first semiconductor chip to a package substrate;
    bonding a first end portion of a wire to a first bonding pad of the first semiconductor chip by using a capillary;
    applying an operating voltage of the first semiconductor chip to the first bonding pad through the wire and determining whether a leakage current in the first bonding pad is detected;
    applying a first voltage to the first bonding pad to determine whether a wire open failure is detected based on a current flowing through the first bonding pad;
    applying a second voltage greater than the first voltage to the first bonding pad to determine whether a wire short failure is detected based on the current flowing through the first bonding pad; and
    bonding a second end portion of the wire to a first connection pad on the package substrate by using the capillary, based on a result of determining whether at least one of the leakage current, the wire open failure, and the wire short failure is detected.

2. The method of claim 1, wherein the first bonding pad comprises a power pad.

3. The method of claim 1, wherein the applying the operating voltage of the first semiconductor chip to the first bonding pad comprises applying the operating voltage of at least about 1.8 V to the first bonding pad.

4. The method of claim 1, further comprising:
    applying a first current to the first bonding pad and detecting a voltage of the first bonding pad;
    determining the wire open failure in response to the detected voltage being less than a third voltage; and
    determining the wire short failure in response to the detected voltage being greater than a fourth voltage, wherein the fourth voltage is greater than the third voltage.

5. The method of claim 1, further comprising:
    bonding an end portion of a second wire to a second bonding pad of the first semiconductor chip; and
    applying a current or a voltage to the second bonding pad through the second wire to detect at least one of the wire open failure and the wire short failure while the capillary is moved to a second connection pad of the package substrate.

6. The method of claim 5, wherein the first bonding pad comprises a power pad and the second bonding pad comprises at least one of a control pad and a data pad.

7. The method of claim 5, wherein the applying the current or the voltage comprises:
    applying a fifth voltage to the second bonding pad to detect the wire open failure based on a current flowing through the second bonding pad; and
    applying a sixth voltage greater than the fifth voltage to the second bonding pad to detect the wire short failure based on the current flowing through the second bonding pad.

8. The method of claim 5, wherein the applying the current or the voltage comprises:
    applying a first current to the second bonding pad and detecting a voltage of the second bonding pad;
    determining the wire open failure in response to the detected voltage being less than a seventh voltage; and
    determining the wire short failure in response to the detected voltage being greater than an eighth voltage, wherein the eighth voltage is greater than the seventh voltage.

9. The method of claim 1, further comprising:
    adhering a second semiconductor chip to the first semiconductor chip; and
    forming a molding member on the package substrate to cover the first and second semiconductor chips.

10. The method of claim 9, further comprising:
    bonding a first end portion of a third wire to a third bonding pad of the second semiconductor chip, by using the capillary;
    applying an operating voltage of the second semiconductor chip to the third bonding pad through the third wire and determining whether a leakage current in the second semiconductor chip is detected; and bonding a second end portion of the third wire to the third connection pad, based on a result of the determining whether the leakage current is detected in the third connection pad.

11. A method of manufacturing a semiconductor package, the method comprising:
adhering a semiconductor chip to a package substrate, the semiconductor chip having a plurality of bonding pads, the package substrate having a plurality of connection pads;
applying an operating voltage of the semiconductor chip to a power pad among the plurality of bonding pads to detect a leakage current in the power pad, when respectively connecting the plurality of bonding pads to the plurality of connection pads by wires;
applying a first voltage to the at least one of a control pad and a data pad to detect a wire open failure based on a current flowing through the at least one of the control pad and the data pad; and
applying a second voltage greater than the first voltage to the at least one of the control pad and the data pad to detect a wire short failure based on the current flowing through the at least one of the control pad and the data pad.

12. The method of claim 11, further comprising:
applying a current or a voltage to the power pad to detect the at least one of the wire open failure and the wire short failure.

13. The method of claim 11, further comprising:
applying a first current to the at least one of the control pad and the data pad and detecting a voltage of the at least one of the control pad and the data pad;
determining the wire open failure in response to the detected voltage being less than a third voltage; and
determining the wire short failure in response to the detected voltage being greater than a fourth voltage, wherein the fourth voltage is greater than the third voltage.

14. An apparatus for bonding a wire in manufacturing a semiconductor package, the semiconductor package comprising a semiconductor chip disposed on a package substrate, the apparatus comprising:
a capillary having a wire inserted therethrough;
a detector electrically connected to the wire and configured to detect at least one of a failure of the wire connected to a bonding pad of the semiconductor chip, and a leakage current of the bonding pad, the capillary connecting the wire to the bonding pad; and
a controller configured to determine whether to connect the bonding pad of the semiconductor chip to a connection pad of the package substrate by using the wire, based on whether the at least one of the failure of the wire and the leakage current is detected, and configured to control an operation of the capillary,
wherein the controller is further configured to apply a first voltage to the bonding pad to detect a wire open failure based on a current flowing through the bonding pad, and apply a second voltage greater than the first voltage to the bonding pad to detect a wire short failure based on the current flowing through the bonding pad.

15. The apparatus of claim 14, wherein the detector comprises:
a voltage source configured to apply a voltage to the bonding pad through the wire; and
a current measurer configured to measure a current flowing through the wire in response to the applied voltage,
wherein the detector is further configured to detect the failure of the wire based on a level of the measured current flowing through the wire.

16. The apparatus of claim 14, wherein the detector comprises:
a current source configured to apply a current to the bonding pad through the wire; and
a voltage measurer configured to measure a voltage of the bonding pad in response to the applied current,
wherein the detector is further configured to detect the failure of the wire based on a level of the measured voltage of the bonding pad.

17. The apparatus of claim 14, wherein the detector comprises:
a voltage source configured to apply an operating voltage of the semiconductor chip to the bonding pad through the wire; and
a current measurer configured to measure the current flowing through the bonding pad in response to the applied voltage,
wherein the detector is further configured to detect the leakage current in the bonding pad based on a measured current flowing through the wire.

* * * * *